(12) United States Patent
Cho et al.

(10) Patent No.: US 6,292,103 B1
(45) Date of Patent: Sep. 18, 2001

(54) ALARM SYSTEM FOR DETECTING WASTE LIQUID DISCHARGE BLOCKAGE

(75) Inventors: Ching Hua Cho, Hsinchu; Ming Chago Chang, Pingdung County; Yih Hwang Huang, Hsinchu; Wei Hao Lai, Taipei County, all of (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/710,711

(22) Filed: Nov. 10, 2000

(30) Foreign Application Priority Data

Aug. 15, 2000 (TW) .................................................. 89214122

(51) Int. Cl.[7] .................................................. G08B 21/00
(52) U.S. Cl. .................. 340/604; 340/605; 340/608; 340/618; 73/53.01; 118/712; 239/71
(58) Field of Search .................................... 340/604, 605, 340/606, 607, 608, 618; 73/40, 53.01, 290 R; 118/688, 712; 239/71, 72

(56) References Cited

U.S. PATENT DOCUMENTS

| 5,169,028 | * | 12/1992 | Morrison | 222/1 |
| 5,312,039 | * | 5/1994 | Sayka et al. | 239/1 |
| 5,313,818 | * | 5/1994 | Sayka et al. | 73/191 |
| 5,762,684 | * | 6/1998 | Hayashi et al. | 95/24 |
| 5,905,656 | * | 5/1999 | Wang et al. | 364/528.18 |

* cited by examiner

Primary Examiner—Edward Lefkowitz
(74) Attorney, Agent, or Firm—Jiawei Huang; J.C. Patents

(57) ABSTRACT

A alarm system for waste liquid discharge blockage for early warning when blockage results from waste liquid. In the blockage alarm system for waste liquid discharge according to the present invention, the discharge line connected to the outlet of waste liquid of the machine is arranged such that the discharge line is angled in the ranges of about 185 to 265 degrees to allow the waste liquid flow smoothly. The first pipe and the second pipe of the sensing line are arranged roughly under the connection of the discharge line and the lowest outlet, and located to make the angle between the first pipe and the discharge line of the sensing region in the range of about 95 to 175 degrees and the angle between the second pipe and the discharge line of the sensing region in the range of about 95 to 175 degrees when the discharge line of the sensing region is vertical. The flow back of the waste liquid into the sensing region can be inhibited. A sensor can be provided in the sensing line for detection of blockage.

9 Claims, 2 Drawing Sheets

ALARM SYSTEM FOR DETECTING WASTE LIQUID DISCHARGE BLOCKAGE

CROSS-REFERENCE TO RELATED APPLICATION

This application claims the priority benefit of Taiwan application serial no. 89214122, Aug. 15, 2000.

BACKGROUND OF THE INVENTION

1. Field of the Invention

The present invention relates to a waste liquid discharge system. More specifically, the present invention relates to a blockage alarm system for a waste liquid discharge machine which enables operators to have early knowledge of a blockage and thus have sufficient time to handle the situation.

2. Description of the Related Art

Photolithography is an important process for semiconductor fabrication. Every part of a semiconductor device such as patterns in the layers and regions implanted with dopants are formed using photolithography. Therefore, the number of lithography processes to be performed or the amount of masks required is a reflection of how difficult a fabrication process is.

Although the photolithography is complex, the basic principle thereof is simple. First, a layer of photosensitive material is applied on a surface of a die. The layer is radiated with parallel light from a light source through a mask mainly made of glass. The pattern on the mask is projected onto a surface of a die and selective development is performed, by which the pattern is transferred to the die. The photosensitive material on the surface of the die is called as a photoresist.

Currently, almost all of the photoresists are coated on the die by spin coating to obtain a photoresist having uniform thickness, high adhesion and no defects. Referring to FIG. 1, a schematic, cross-sectional view of rotator for spin coating and a conventional waste liquid discharge system are shown. The shift of the rotator 10 provides an appropriate vacuum to attach the wafer 12 thereon. When the rotator 10 rotates the wafer 12, the photoresist liquid 14 applied on the surface of the wafer 12 is moved toward the edge of the wafer 12 due to the action of the centrifugal force and finally a photoresist layer 16 having a uniform thickness is formed.

With high speed rotation of the rotator, some photoresist liquid 21 is spun off the wafer 12. Usually, a fixed container 20 is used to surround the wafer 12 to collect photoresist liquid spun off of the wafer 12, as shown in FIG. 1. The photoresist liquid 21 is transported to a discharge line 26 through the sides 22, 24 of the fixed container 20. Because the photoresist liquid is a liquid with high consistency, blockage often occurs in the non-vertical sections such as transversal transmitting part 28 in FIG. 1 when the discharge line 26 is not arranged in vertical direction. The photoresist may accumulate up to a level higher than the height of the machine and flow back on the machine. It is dangerous for the machine and operators because the above waste liquid may be a toxic waste liquid. If the toxic liquid is spilled, it takes time to evacuate people from the scene and perform post treatment.

SUMMARY OF INVENTION

Therefore, it is one object of the present invention to provide an alarm system for detecting waste liquid discharge blockage, which provides early warning when blockage occurs in the above discharge lines to inform operators of the situation and enable them to have enough time to handle the same.

The present invention provides an alarm system for detecting waste liquid discharge blockage which provides previous warning when blocking results from waste liquid generated in a plurality of machines. The above alarm system for detecting waste liquid discharge blockage comprises a discharge line, a sensing line, at least one sensor and an alarm.

The discharge line is connected to a plurality of outlets of the machine to receive waste liquid discharged, in which a section of the discharge line under the connection of the discharge line and the lowest outlet is selected as a sensing region. The discharge line of the sensing region is angled with respect to the horizontal in the range of 185 to 265 degrees so the waste liquid can flow smoothly. The sensing line has a first pipe and a second pipe, both arranged in the sensing region. The angle between the first pipe and the discharge line of the sensing region is in the range of 95 to 175 degrees when the discharge line of the sensing region is vertical. The angle between the second pipe and the discharge line of the sensing region is in the range of 95 to 175 degrees when the discharge line of the sensing region is vertical. Further, at least a sensor is located in the sensing line, which sensor outputs a sensor signal when detecting any waste liquid.

With the design of the sensing region of the discharge line angled in the range of 185 to 265 degrees with respect to the horizontal, the waste liquid can be discharged smoothly. Even when blockage occurs, the improper flow of waste liquid into the sensing region, which would affect the detection of waste liquid blockage inside the sensor, can be inhibited by the arrangement of the first pipe and the second pipe in the sensing region and control of the angle in the range of 95 to 175 degrees when the discharge line of the sensing region is vertical.

The above waste liquid can be photoresist liquid, for example. The angle between the first pipe and the discharge line and the angle between the second pipe and the discharge line can be designed to be the same. The alarm can be a beeper, a speaker or a flashing light, for example. In the case that two sensors are used, the alarm can be a beeper that generates sounds with different frequencies as different warning signals. Alternatively, a speaker is used to generate different kinds of music as different warning signals. A flashing light can be also used to generate different colors as different warning signals.

BRIEF DESCRIPTION OF THE DRAWINGS

It is to be understood that both the foregoing general description and the following detailed description are exemplary, and are intended to provide further explanation of the invention as claimed.

The accompanying drawings are included to provide a further understanding of the invention, and are incorporated in and constitute a part of this specification. The drawings illustrate embodiments of the invention and, together with the description, serve to explain the principle of the invention. In the drawings.

DESCRIPTION OF THE PREFERRED EMBODIMENT

Figure 1:
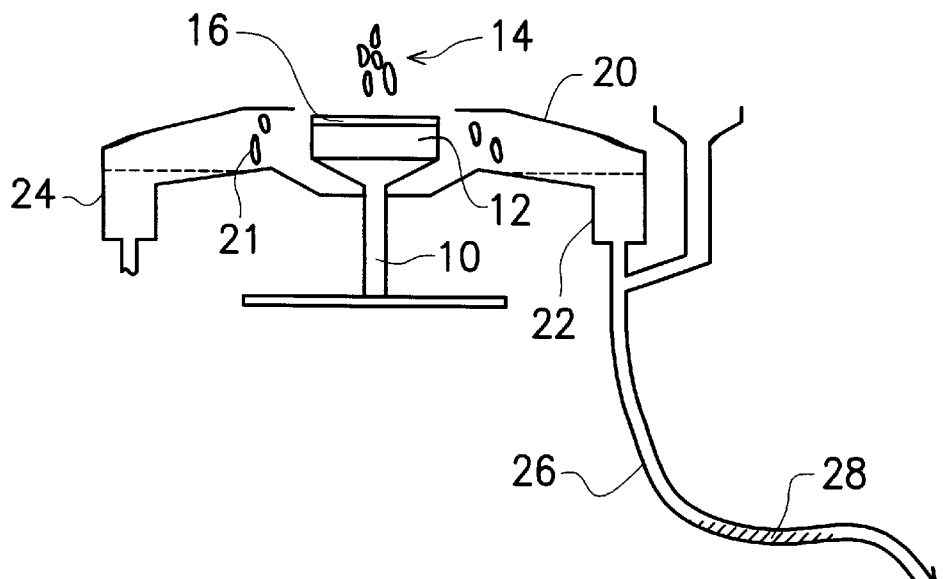
FIG. 1 is a schematic, cross-sectional view of rotator for spin coating and a conventional waste liquid discharge system.

Reference will now be made in detail to the present preferred embodiments of the invention, examples of which are illustrated in the accompanying drawings. Wherever possible, the same reference numbers are used in the drawings and the description to refer to the same or like parts.

Figure 2:
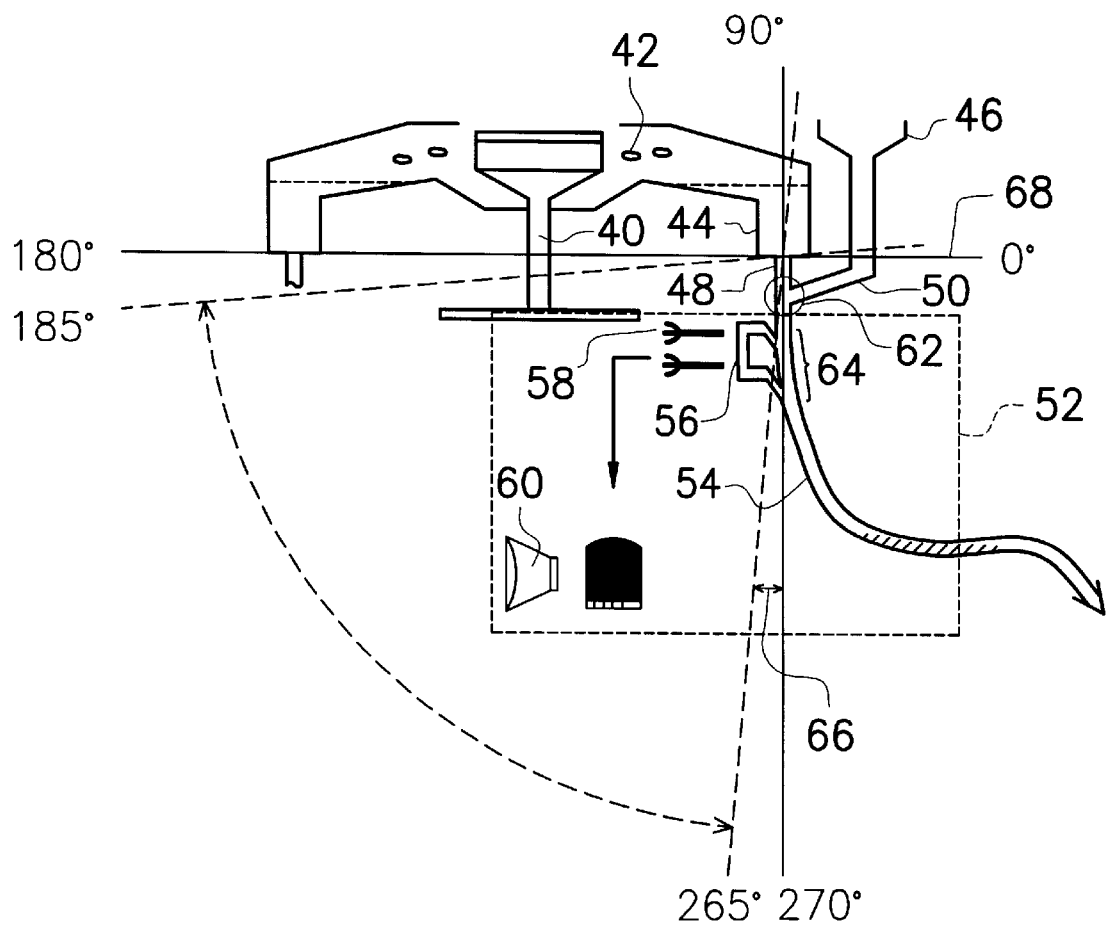
FIG. 2 is a schematic, cross-sectional view of an alarm system for waste liquid discharge blockage according to one preferred embodiment of the present invention.

FIG. 2 is a schematic, cross-sectional view of an alarm system for detecting waste liquid discharge blockage according to one preferred embodiment of the present invention. It is not certain that contents of each section of the line are transported in direction of from top to bottom because of the extremely long path for discharging waste liquid. Blockage may be result from less attraction of gravity in some sections located horizontally. If the liquid discharged has higher consistency, then such blockage is increased. In order to get the information about the blockage of the waste liquid to protect the machine and the operators from danger, an alarm system for detecting waste liquid discharge blockage shown in FIG. 2, which shows a preferred embodiment of the present invention, is used.

In the figure, waste liquid generated from a plurality of machines, such as a photoresist liquid 42 discharged from a rotator 40 and waste liquid discharged from other machine, flow through different conduits 48, 50 to the blockage alarm system for waste liquid discharge according to the present invention from an outlet 40 of the rotator 40 and an outlet 46 of another machine, for example.

The alarm system 52 for detecting waste liquid discharge blockage according to the present invention comprises a discharge line 54, a sensing line 56, a sensor 58 and an alarm 60. The discharge line 54 is connected to the outlets 44, 46 of machines through the conduits, such as conduits 48, 50, to receive the waste liquid generated from the machines. A section of the discharge line 54 under the connection of the discharge line 54 and the lowest outlet 46 is selected as a sensing region 64. As shown by the broken line in FIG. 2, the angle 66 between the discharge line 54 of the sensing region 64 and the horizontal is in the range of 185 to 265 degree. If the discharge line 54 of the sensing region 64 is horizontal, blockage occurs in the sensing region 64. If the discharge line 54 is vertical, waste liquid may flow into the sensing line 56, resulting in transmission of a sensor signal from the sensor 58. With arrangement of the discharge line 54 between the vertical direction and horizontal direction, horizontal blockage can be prevented and the waste liquid can thus flow smoothly. In case of blockage, detection is carried out by sensing region 64.

Figure 3:
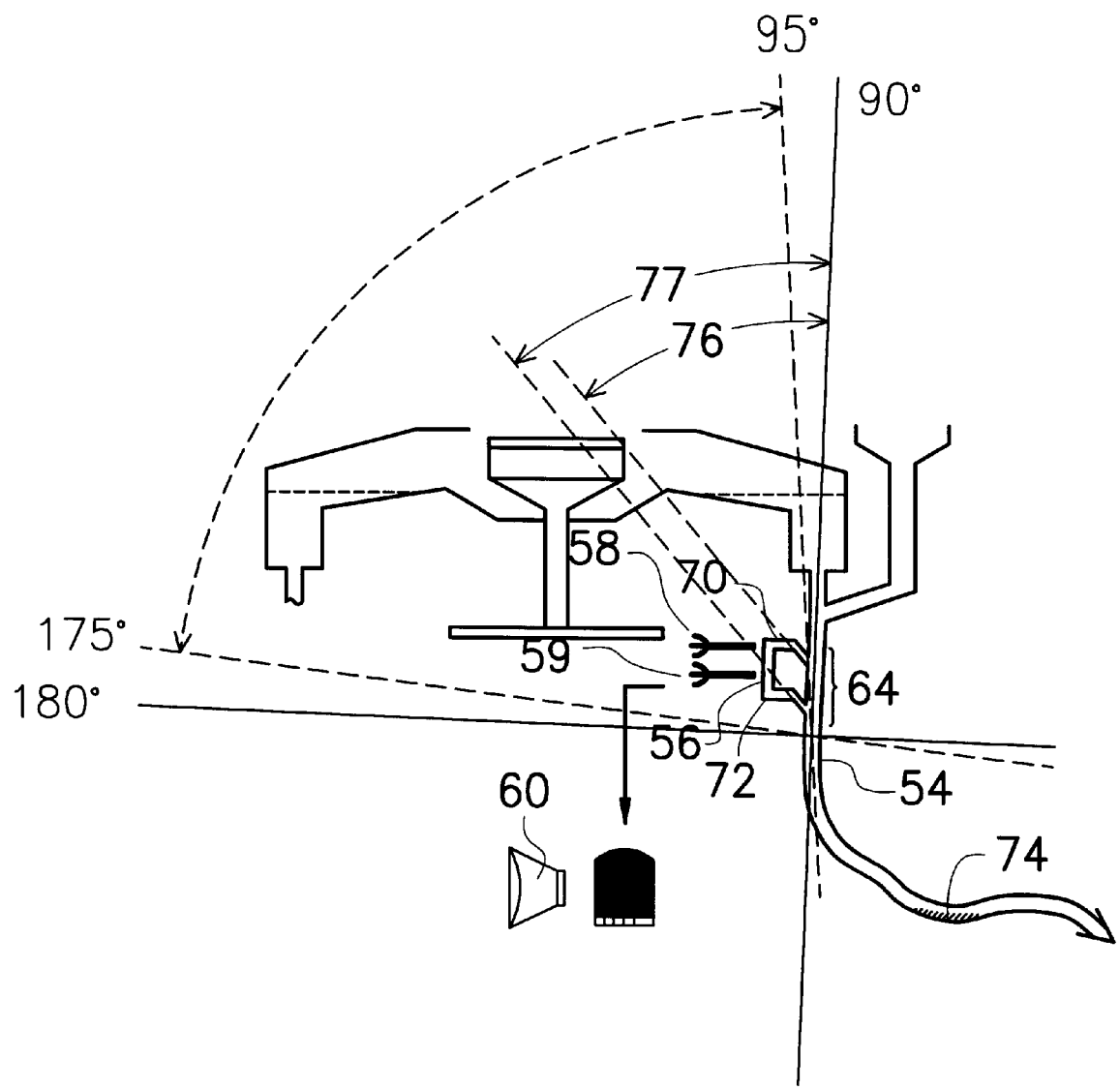
FIG. 3 is a diagram showing the angle range of the sensing line of the alarm system for detecting waste liquid discharge blockage in FIG. 2.

Subsequently, the angle range of the sensing line of the alarm system for detecting waste liquid discharge blockage according to the present invention is illustrated with reference to FIG. 3 which has the same structure as in FIG. 2. The same reference numerals represent the same elements. A sensing line 56 has a first pipe 70 and a second pipe 72, both located in the sensing region 64. Furthermore, an angle 76 between the first pipe 70 and the discharge line 54 of the sensing region 64 ranges from 95 to 175 degrees when the discharge line 54 of the sensing region 64 is vertical. An angle 77 between the second pipe 72 and the discharge line 54 of the sensing region 64 ranges from 95 to 175 degrees when the discharge line 54 of the sensing region 64 is vertical, that is, when the discharge line 54 of sensing region 64 the is angled 90 degrees to the horizontal. It is intended to prevent the waste liquid from flowing into the sensing region 64 through the first pipe 70 or the second pipe 72 when the line or pipe is not blocked, which may result in a disordered alarm is the sensor 58 in the sensing line 56 fails. It should be understood that the angle 76 between the first pipe 70 and the discharge line 54 and the angle 77 between the second pipe 72 and the discharge line 54 need not be the same, provided that they range from 95 to 175 degrees.

Further, one or more sensors are provided in the sensing line 56. The number of sensors is not limited to one. Usually, two sensors are used to set up two cordons. When the discharge line 54 is blocked, blockage 74 causes waste liquid to accumulate. The second pipe 72 and the sensing region 64 fill with waste liquid as the level of the waste liquid reaches the sensing region 64. The sensor 59 first detects the level of the blockage. Then the sensor 59 outputs a sensor signal to the alarm connected to the sensor 59 and transmits an alarm signal to operators. In the case that the machine is in use and cannot be stopped immediately, more than one sensor 58 is further required on the sensing line 56 to alert operators early on.

Additionally, the above alarm can be a machine with warning functions such as beeper, speaker or flashing light. In the case of the two sensors as shown in the figures, the alarm can be a beeper that generates sounds with different frequencies as different warning signals. Alternatively, a speaker is used to generate different kinds of music as different warning signals. A flashing light can be also used to generate different colors as different warning signals.

In view the of foregoing, the sensing region of the discharge line is designed to be angled from the horizontal in the range of 185 to 265 degrees so as to discharge the waste liquid smoothly in the alarm system according to the present invention. If blockage occurs, detection is carried out by the sensor(s) in the sensing line. Further, the first pipe and the second pipe of the sensing line are arranged in the sensing region and controlled to be in the range of 95 to 175 degrees when the discharge line of the sensing region is vertical. With such an arrangement, improper flow of the waste liquid can be inhibited, and the alarm works only when a waste liquid blockage occurs.

It will be apparent to those skilled in the art that various modifications and variations can be made to the structure of the present invention without departing from the scope or spirit of the invention. In view of the forgoing, it is intended that the present invention cover modification and variation of this invention provided they fall within the scope of the following claims and their equivalents.

What is claimed is:

1. A alarm system for detecting waste liquid discharge blockage in an machine, comprising:

a discharge line connected to a plurality of outlets of the machine to receive a waste liquid discharged, wherein a section of the discharge line under a connection of the discharge line and a lowest outlet is selected for use as a sensing region, and the discharge line in the sensing region is angled from a horizontal in a range of about 185 to 265 degrees so that the waste liquid flows smoothly;

a sensing line having a first pipe and second pipe, both arranged in the sensing region, wherein a first angle between the first pipe and the discharge line of the sensing region is in a range of about 95 to 175 degrees when the discharge line of the sensing region is vertical and a second angle between the second pipe and the discharge line of the sensing region is in a range of about 95 to 175 degrees when the discharge line of the sensing region is vertical to prevent the waste liquid from flowing into the sensing region when no blockage exists;

at least a sensor located in the sensing line, wherein the sensor outputs a sensor signal when detecting any waste liquid; and an alarm connected to the sensor which transmits a warning signal when receiving the sensor signal.

2. The alarm system for waste liquid discharge blockage of claim 1, wherein the waste liquid comprises a photoresist.

3. The alarm system for waste liquid discharge blockage of claim 1, wherein the first angle between the first pipe and the discharge line of the sensing region and the second angle between the second pipe and the discharge line of the sensing region are the same.

4. The alarm system for waste liquid discharge blockage of claim 1, wherein the alarm is a beeper.

5. The alarm system for waste liquid discharge blockage of claim 1, wherein the alarm is a speaker.

6. The alarm system for waste liquid discharge blockage of claim 1, wherein the alarm is a flashing light.

7. The alarm system for waste liquid discharge blockage of claim 1, wherein two sensors are used, and the alarm is a beeper which generates sounds with different frequencies as different warning signals.

8. The alarm system for waste liquid discharge blockage of claim 1, wherein two sensors are used, and the alarm is a beeper which generates different kinds of music as different warning signals.

9. The alarm system for waste liquid discharge blockage of claim 1, wherein two sensors are used, and the alarm is a flashing light which generates different colors as different warning signals.

* * * * *